United States Patent [19]

Taraki

[11] Patent Number: 5,784,284
[45] Date of Patent: Jul. 21, 1998

[54] TECHNIQUE FOR PLOTTING A VARIABLE-WIDTH SIGNAL IN A FIXED-WIDTH PLOT AREA

[75] Inventor: Yosuf M. Taraki, Evanston, Ill.

[73] Assignee: Snap-on Tools Company, Kenosha, Wis.

[21] Appl. No.: 566,376

[22] Filed: Dec. 29, 1995

[51] Int. Cl.$^6$ .............................. G06T 3/40; G06F 19/00
[52] U.S. Cl. ............... 364/487; 701/101; 701/102; 345/132; 345/133; 345/134; 324/379
[58] Field of Search ................ 364/431.03, 431.04, 364/487, 715.02; 345/133, 134, 148, 149, 202, 132; 324/378, 379, 384, 391, 393, 394, 395; 341/122; 395/140, 507, 508, 509; 73/116, 117.2, 117.3; 382/299; 701/101, 102

[56] References Cited

U.S. PATENT DOCUMENTS

| | | | |
|---|---|---|---|
| 4,039,784 | 8/1977 | Quarton et al. | 235/151 |
| 4,208,626 | 6/1980 | Gregg, Jr. | 324/77 A |
| 4,480,271 | 10/1984 | Coleman, Jr. | 358/310 |
| 4,624,009 | 11/1986 | Glenn et al. | 381/43 |
| 5,093,872 | 3/1992 | Tutt | 382/56 |
| 5,109,437 | 4/1992 | Honda | 382/56 |
| 5,109,438 | 4/1992 | Alves et al. | 382/56 |
| 5,150,461 | 9/1992 | Reynolds | 395/164 |
| 5,159,438 | 10/1992 | Rabii | 358/12 |
| 5,208,871 | 5/1993 | Eschbach | 382/41 |
| 5,237,313 | 8/1993 | Paxton et al. | 340/735 |
| 5,262,871 | 11/1993 | Wilder et al. | 358/213.11 |
| 5,270,695 | 12/1993 | Chapman et al. | 345/131 |
| 5,272,545 | 12/1993 | Mita | 358/464 |
| 5,303,313 | 4/1994 | Mark et al. | 382/56 |
| 5,333,615 | 8/1994 | Craelius et al. | 128/696 |
| 5,335,295 | 8/1994 | Ferracini et al. | 382/47 |
| 5,335,296 | 8/1994 | Larkin et al. | 382/47 |
| 5,347,478 | 9/1994 | Suzuki et al. | 364/715.02 |
| 5,371,842 | 12/1994 | Easton et al. | 395/140 |
| 5,397,981 | 3/1995 | Wiggers | 324/121 R |
| 5,410,616 | 4/1995 | Kidd | 382/47 |
| 5,444,832 | 8/1995 | Suzuki | 395/132 |
| 5,684,507 | 11/1997 | Rasnake et al. | 345/134 |
| 5,684,508 | 11/1997 | Brilman | 364/134 |

*Primary Examiner*—Emanuel Todd Voeltz
*Assistant Examiner*—Tony M. Cole
*Attorney, Agent, or Firm*—Emrich & Dithmar

[57] ABSTRACT

A data acquisition device permits plotting of cylinder firing cycles, of varying-frequency, on a fixed-plot area of a CRT screen. Each cylinder firing cycle is sampled, at a constant sample rate, and consecutive sets of sample points, each containing a fixed number of sample points, is generated. On the basis of a unique data reduction technique triggered after the collection of each consecutive sample-point set, certain of the sample points considered superfluous are deleted from the set and the remaining appended to a temporary buffer. The sample-points in the temporary buffer further undergo reduction of the sample points when certain conditions occur, such as buffer full, at which time certain ones are discarded and others are kept. At the end of a cylinder firing cycle, the remaining points are further reduced and a final-set is generated, representative of a full cylinder firing waveform, consisting of sample points equal in number to the plot-width of the CRT screen.

20 Claims, 2 Drawing Sheets

TECHNIQUE FOR PLOTTING A VARIABLE-WIDTH SIGNAL IN A FIXED-WIDTH PLOT AREA

BACKGROUND OF THE INVENTION

1. Field of the Invention

The present invention relates to a technique for plotting a variable-width signal in a fixed-width plot area of a monitor screen. More particularly, the present invention relates to an apparatus and associated method for plotting a variable-width waveform signal of one or more consecutive cylinder firing cycles of an internal combustion engine in a fixed-width plot area of a screen using a constant sample rate.

2. Description of the Prior Art

Engine analyzers sense, measure, store and then display engine data, in some form or another, to an attached monitor. Monitors have a fixed plot width, predefined by each monitor's maximum pixel width. A typical monitor has a fixed pixel-dot, horizontal graphical width, usually 640 pixels wide, a portion of which—typically 560 pixels—is allocated for plotting waveforms. For internal combustion engine analysis, the plotting of cylinder firing information— including both primary and secondary voltage signals, over a range of engine speeds (varying frequency)—is useful to an automotive technician. However, when sampling a variable-frequency analog signal of an engine cylinder firing that will ultimately be plotted, the maximum number of points that can be sampled, during a varying-interval waveform, necessarily varies as a function of engine RPM. Assuming a fixed sample rate, a cylinder firing signal from a fast-revving (high RPM) engine is sampled fewer times than it would be at low RPM (low frequency). In fact, the lower the RPM (long time between cylinder firings), the greater the number of points sampled per cylinder cycle.

Because the sampled data points must be stored in memory, at very low RPM available memory limitations pose a problem. Thus, unless a large enough buffer is dedicated for this purpose, and it usually is not, the complete waveform cannot be captured. Also, since a partial-plot of a cylinder firing is generally less useful than a plot of the entire waveform on the monitor screen, it is a waste of memory resources to assign large memory space for sampled waveform information, when a significant portion of that information will ultimately be discarded before display of the cylinder firing waveforms because of the limited width of the display.

As a way to overcome these problems, some prior art techniques vary the sampling rate as a function of engine RPM. The drawback to this, however, is that an external RPM or period measuring source is necessary in order to reset the sample rate. There is also the further drawback that when RPM changes during a cylinder firing, waveform jitter results on the display.

With varying sample rate techniques, well-known routines are provided which permit sampling at those intervals of time for which useful pixel information is produced. Thus, when a 560 pixel waveform is to be displayed, data is sampled at predetermined intervals calculated on the basis of the known RPM rate.

With non-varying (constant) sample rate techniques, all of the points captured during a complete cylinder firing by sampling the analog-input, variable-frequency signal at a fixed sampling rate, are stored in large memory buffers. For full-screen display on a conventional 560-pixel monitor, only the 560 most relevant sampling points are then isolated to generate a displayable cylinder-firing waveform. This is accomplished by any of a number of well-known waveform point-compression routines. Typically, such compression routines—associated with constant sample rate sampling of variable-frequency signals—identify and discard the non-relevant or redundant sample points of a variable width signal. Where a number of previously-sampled cylinder firing signals are to be plotted, point-compression typically is performed at the end of a series of consecutive cylinder firing cycles, typically at the end of a complete engine cycle. Thus, where a fixed sampling rate is used, a large enough buffer memory must be available for all the points sampled for an entire engine cycle. The memory capacity must be quite high to accommodate low engine speeds. Accordingly, if data compression is to occur at the end of multiple consecutively sampled cylinder firing cycles, for example at the end of an engine cycle, the problem with insufficient memory space to store all the sampled points is particularly significant.

Compression routines of the type described above are quite conventional and are of either the floating-point or scaled-integer type as described generally in U.S. Pat. No. 5,150,461 to Reynolds, which patent is owned by the assignee of the present invention. Floating-point compression routines, while more accurate, consume a significant portion of available processor time and are only now—with the increased processing speed of modern computers— becoming more popular.

The major overall distinction between constant sample rate techniques and variable sample rate techniques is that the latter require an additional resource that provides for direct measurement of RPM or signal period, such as with an external RPM measuring source. Constant rate sampling techniques, on the other hand, do not rely on a direct measurement of RPM or frequency, but require a large memory capacity to store all sampled points.

U.S. Pat. No. 5,397,981 to Wiggers describes a constant sample rate technique as employed in a digital storage oscilloscope. In this regard, a stream of digital samples derived by sampling, at a constant rate, a variable-frequency, input-repetitive signal, are stored by an acquisition unit in a fast-acquisition memory (FAM). When the acquisition unit receives a trigger (interrupt) from an associated trigger circuit, acquisition is terminated and the stored samples are transferred to a main acquisition memory (MAM). The acquisition unit processes the digital samples in accordance with a calculated time base reduction factor (TBRF) provided by a system CPU to provide a waveform display memory resolution of a predetermined number of samples per division. The acquisition unit also measures the time period of one cycle of the input repetitive signal for each completed acquisition, and adjusts the number of digitized samples per display division to update each display following acquisition, so that the width of the display remains constant despite changes in frequency of the input repetitive signal. Additionally, the oscilloscope horizontal display (sweep pattern) may be selectively changed by an oscilloscope user to select one or more cycles, or portions of cycles, of a waveform of the input repetitive signal for viewing, and the oscilloscope will automatically establish the desired display. Data compression involves first calculating the period of each cycle of an input repetitive signal and then, on the basis of the number of cycles to be displayed at a given sweep rate, a TBRF value is determined. The TBRF value is then used to discard non-relevant or redundant points from the total points acquired by the acquisition unit, the rest being stored in the display memory. The number of points stored for each cycle to be plotted is therefore a function of the sweep rate at the time of data acquisition. Consequently, when the sweep pattern consists of several displayable cycles at one time, in order to use the Wiggers system to display only one of those cycles across the full screen width of the monitor, would obviously require some duplication of the points collected for that cycle.

The Wiggers technique eliminates the need for a large buffer, since only a predefined number of sample points are actually ever stored during a given cycle. The disadvantage of this scheme, however, is that a sudden, dramatic change in RPM during data acquisition—quite common when plotting engine cylinder-firing waveforms—will result in jitter. This is particularly true at low RPM, where a proportionately greater number of consecutive points are discarded.

With regard to plotting of cylinder-firing waveforms, it is very important that very dramatic, high-amplitude spikes, occurring in the beginning of each cylinder-firing cycle, are properly plotted. Because the Wiggers algorithm arbitrarily collects every (n)th point sampled by the acquisition unit, it will recurringly fail to detect—and therefore be unable to plot—such sharp spikes.

SUMMARY OF THE INVENTION

It is a general object of the invention to provide a unique constant-sample-rate data reduction technique, which discards superfluous captured sample points several times during each cycle of an input repetitive signal, for displaying variable-width waveforms in a fixed-width area on a screen, in a manner which overcomes the memory limitation problem of conventional techniques regarding sampling of a low-frequency input repetitive signal.

It is another object of the present invention to provide a unique data reduction technique, which discards superfluous captured sample points several times during each cycle of an input repetitive signal, for producing a set of sample data points representative of the amplitude of an input repetitive signal at temporally equidistant time intervals over one waveform cycle, whereby the numbers of sample points are equal to a predetermined fixed number regardless of signal frequency and are selected without prior knowledge of the period of any given cycle.

It is another object of the invention to provide a data reduction technique, which discards superfluous captured sample points several times during a cylinder firing cycle, for use in selectively plotting an entire engine firing cycle, individual cylinder firing cycles, or consecutive cylinder firing cycles of a user-selected cylinder of an internal combustion engine, over a fixed-width area of an analyzer screen.

It is another object of the present invention to provide a data reduction technique for plotting, in substantially real-time, multiple consecutive frames—each representative of a single engine cycle of an internal combustion engine—and storing them in fixed size buffers, to provide a retrievable collection of frames for later inspection in non-real time (review mode).

These and other features of the invention are provided by a data acquisition device for plotting at least one cycle of a repetitive analog input signal of varying-frequency on a fixed-plot area of a display device having a horizontal plot axis defined by a fixed number of pixels. The data acquisition device includes a sampling unit for sampling, at a constant sample rate, each cycle of the repetitive input signal to generate and collect, during each cycle, consecutive sets of sample points each containing a fixed number of sample points. In turn, a final set of sample points is generated, equal in number to the fixed number of pixels, and containing a portion of each of the consecutive sets.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE PREFERRED EMBODIMENT

Figure 1:
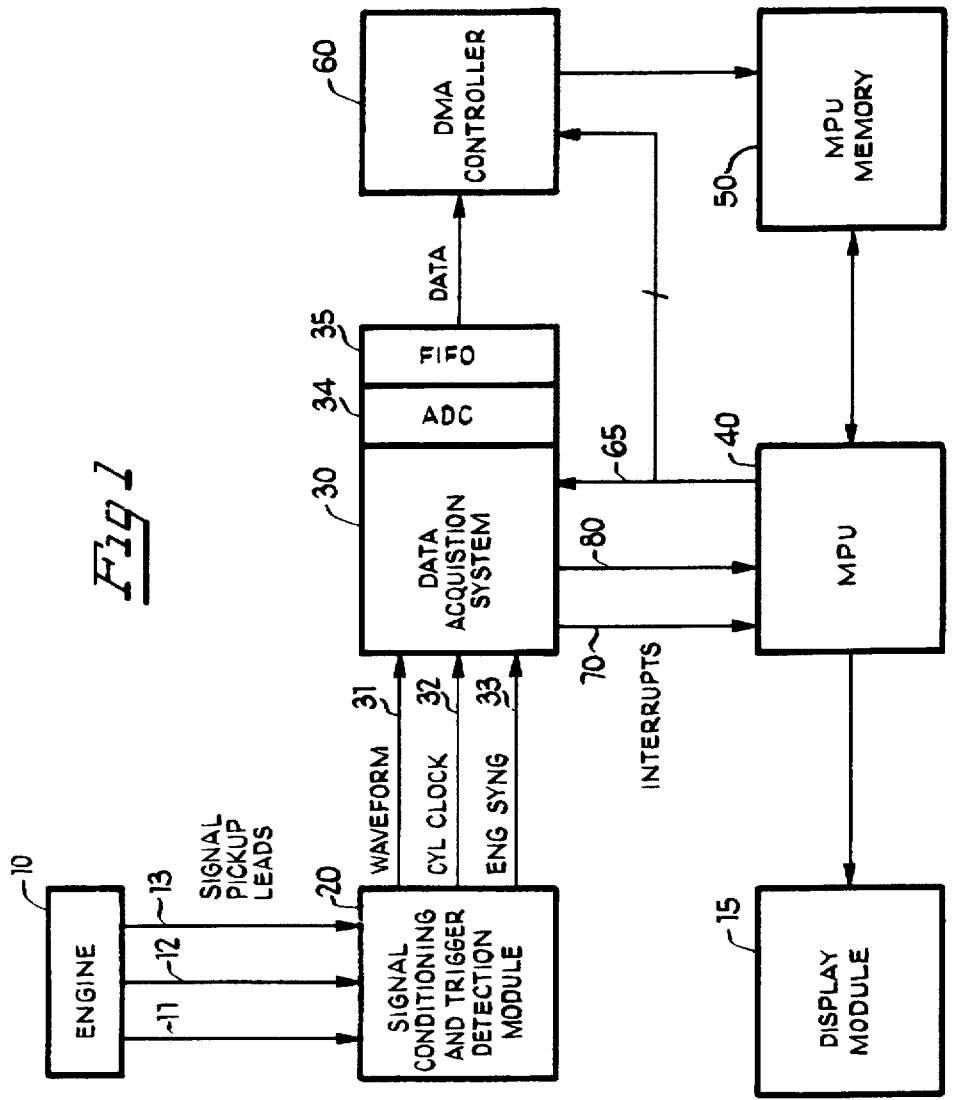
FIG. 1 shows a functional block diagram of a system for plotting an input repetitive waveform signal representative of consecutive engine cylinder-firing cycles of an internal combustion engine, on the basis of a constant sample rate technique for capturing, compressing, and displaying the signal in accordance with the present invention.

Turning now to the drawings, and more particularly FIG. 1 thereof, there is depicted a data processing system, incorporating the features of the invention, for executing a data reduction technique, described in greater detail below in connection with FIGS. 2–4, to display cylinder waveforms—captured from a running internal combustion engine 10—in a fixed-width area on a color CRT display module (screen) 15.

The major system components utilized in the data reduction system are shown in FIG. 1. Electrical signals are obtained from the engine 10 by means of signal pickup leads 11 and 12 and trigger pickup lead 13 which feed into the signal conditioning and trigger detection module 20. Module 20 converts the "raw" analog signals sensed by pickup leads 11 and 12—corresponding respectively to the primary and secondary ignition signals of the engine 10—to a form suitable for processing by a data acquisition system (DAS) 30. The conditioned signal is communicated to the DAS over line 31. Module 20 also generates two digital signals, including a cylinder clock signal 32 indicative of cylinder firings and an engine sync signal 33 indicative of the firing of cylinder number one.

The DAS 30 includes an onboard analog-to-digital converter (ADC) 34 that performs analog-to-digital conversion of the input waveform signal(s), based on instructions received from an MPU 40. The digital sampled output of the DAS 30 is piped into an onboard first-in-first-out memory (FIFO) 35 and from there the data are stored in the main MPU memory 50 by means of a direct memory access (DMA) controller 60. An Initial Setup routine, to be discussed below in connection with FIG. 2, is initially entered at start-up, which allows the MPU 40 to provide overall system initialization and to control DMA and DAS functions via control lines 65.

In addition to performing ADC conversions, the DAS 30 generates two types of interrupts to the MPU 40. A DMA interrupt 70 occurs whenever the DMA controller 60 completes the requested number of data point transfers. DMA interrupt 70 is processed by a DMA interrupt service routine (DMA ISR), in a manner to be described below in connection with FIG. 3. A cylinder interrupt 80 occurs whenever a cylinder firing is detected and is processed by a cylinder interrupt service routine (Cylinder ISR), described in FIG. 4. Occurrence of either interrupt causes the DAS 30 to temporarily stop DMA 60 operation, which is later restarted under MPU 40 control. DAS 30 continues, however, to sample digital sample points of the analog input waveform data, while DMA operation is halted, and to store the data in the FIFO 35 until DMA operation resumes, which will occur before the FIFO 35 is full.

After initialization, the MPU 40 instructs the DAS 30 to begin data sampling and storing of cylinder firing information from engine 10, in accordance with the data reduction algorithm of the present invention. The purpose of this algorithm is to produce a set of data points representing the amplitude of the signal at spaced time intervals over one cylinder period. The number of data points is equal to a fixed number (PLOT_WIDTH) regardless of the engine speed. PLOT_WIDTH is the width of the waveform-plotting portion of the scope screen in pixels and is equal to 560 in the monitor module 15 of the illustrative embodiment.

The data reduction algorithm will now be described with reference to the flowcharts shown in FIGS. 2-4. Initially, the software allocates two data buffers in the MPU memory 50, each having a size of PLOT_WIDTH*2 data points. The first is the DMA buffer which receives data from the DMA controller 60. The second buffer is the reduction buffer, which is used to store data from the DMA buffer, after being processed by the reduction algorithm. As will be explained below, data reduction occurs several times during a cylinder firing. This presumes that the rate at which the DAS performs data sampling (ADC conversions), which is at a predetermined, constant sample rate, is faster by at least a factor of PLOT_WIDTH than the rate (frequency) of the incoming cylinder firing signals, which rate is a proportional to engine RPM. The algorithm maintains a parameter called REDUCTION_FACTOR, which is used to determine how much data to discard as new data is copied from the DMA buffer to the reduction buffer. For every data point retained, REDUCTION_FACTOR-1 data points are discarded. For example, if REDUCTION_FACTOR is 4, 3 out of 4 data points are discarded. REDUCTION_FACTOR is initially set to 2 at the start of a cylinder capture cycle, and is repeatedly doubled. Thus, the value of REDUCTION_FACTOR will always be a power of 2.

The data reduction algorithm works as follows. The DAS is set up to perform ADC conversions (digital sampling) at a fixed, predetermined rate. At the start of a cylinder capture cycle (triggered by a cylinder firing—trigger pickup lead 13), the DMA controller 60 is programmed to transfer PLOT_WIDTH*2 ADC conversions into the DMA buffer. When the DMA controller 60 completes the transfer, a DMA interrupt activates the DMA ISR which processes the data in the DMA buffer and starts another round of DMA transfers. This process is repeated until the next cylinder fires, activating the Cylinder ISR, which saves the captured data in a cylinder storage buffer and starts another cylinder capture cycle. Details of the ISR are discussed below.

Figure 2:
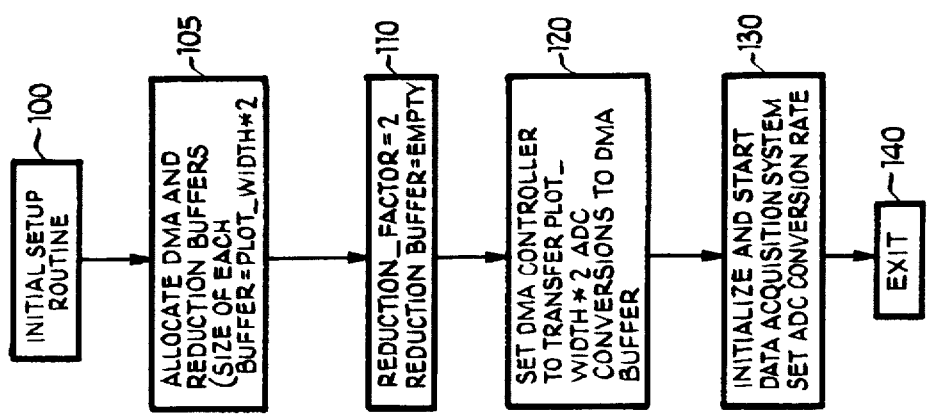
FIG. 2 is a flowchart of the initial setup routine for capturing of cylinder waveform data.
Figure 3:
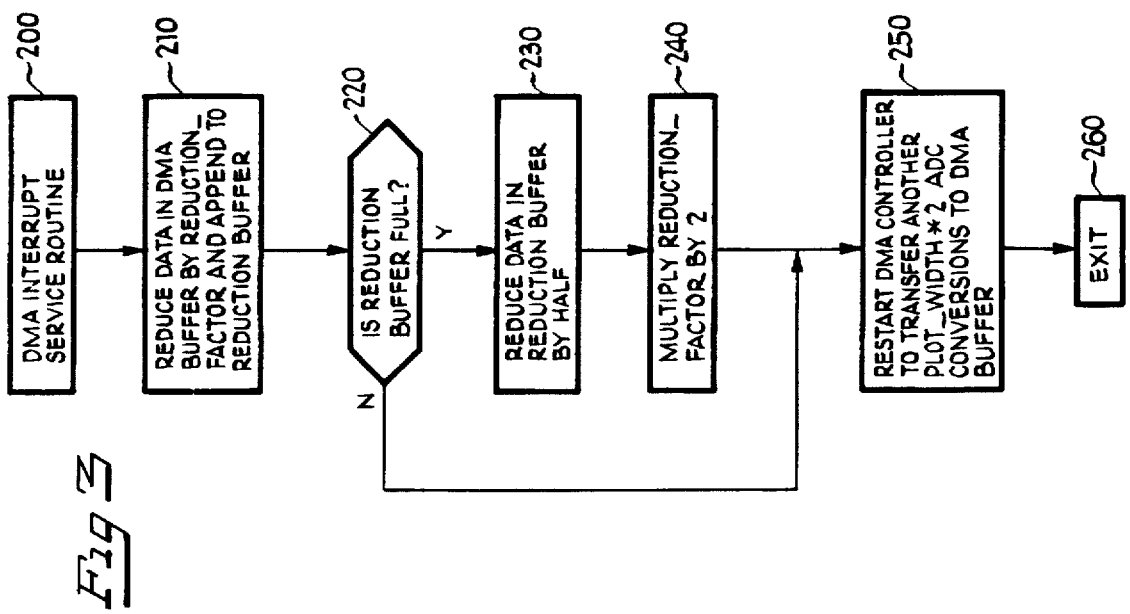
FIG. 3 is a flowchart of the DMA interrupt service routine executed when the DMA controller reached terminal count.

Referring to FIG. 2, the following initialization routine is executed before cylinder waveform capture and data acquisition begins (110–140). First, an appropriate memory size is allocated for each of the DMA and reduction buffers (105). The REDUCTION_FACTOR is then set to two and the reduction buffer declared empty (110). Immediately after, the DMA controller 60 is programmed to transfer PLOT_WIDTH*2 ADC conversions to the DMA buffer (120). Thereafter, some initialization takes place again at the end of the Cylinder ISR, as explained below in connection with FIG. 4.

The DMA ISR (see FIG. 3) performs data reduction as it processes newly captured data. Each time a DMA interrupt occurs (whenever the DMA buffer is full), the data in the DMA buffer are reduced by the current REDUCTION_FACTOR and added to the contents of the reduction buffer (210). The program then asks (220) if the reduction buffer is full and, if it is not, restarts DMA operation (250) and exits the DMA ISR (260). This process is repeated (250) until the reduction buffer is full (220), at which time the contents of the reduction buffer are reduced in half (230), and at the same time the REDUCTION_FACTOR is doubled (240). Because the size of the reduction buffer is PLOT_WIDTH*2, reducing the full buffer in half results in PLOT_WIDTH data points. In this manner, after occurrence of the first DMA interrupt in a cylinder capture cycle, the data count in the reduction buffer will be PLOT_WIDTH and after succeeding DMA interrupts the count will vary between PLOT_WIDTH and PLOT_WIDTH*2.

Figure 4:
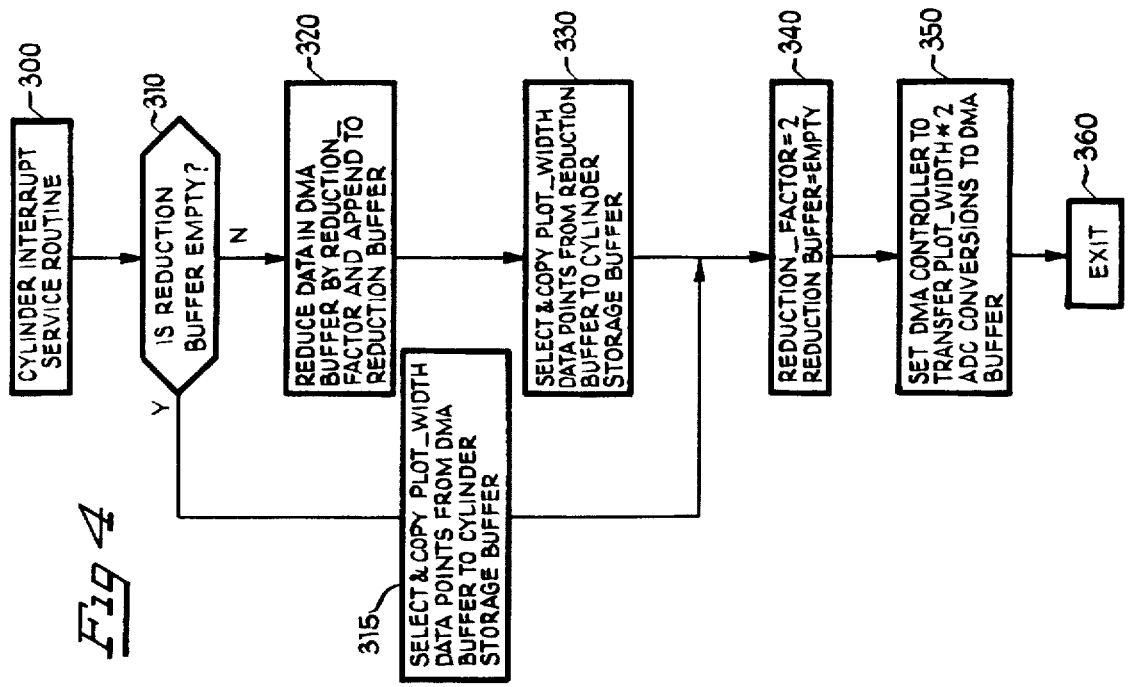
FIG. 4 is a flowchart of the cylinder interrupt service routine executed when a cylinder initially fires.

Eventually the next cylinder will fire and activate the Cylinder ISR, which is shown in FIG. 4. At this point the DMA buffer will typically contain some data but the reduction buffer may or may not contain any data. If the reduction buffer is empty (no DMA interrupt has occurred), PLOT_WIDTH data points are selected from the DMA buffer and copied to a cylinder storage buffer (310, 315). If PLOT_WIDTH data points have not been accumulated in the DMA buffer, selective duplication of some of the sample points, in a conventional manner, will be necessary. If the reduction buffer is not empty, the data in the DMA buffer is reduced by REDUCTION_FACTOR and added to the existing data in the reduction buffer (310,320). PLOT_WIDTH data points are then selected from the reduction buffer and copied to the cylinder storage buffer (330). Then another cylinder capture cycle is reinitiated (340, 350) and the cylinder ISR is exited (360). The process of selecting PLOT_WIDTH data points from the reduction buffer is similar to the method described in U.S. Pat. No. 5,150,461, discussed in the Description of the Prior Art.

The workings of this algorithm can best be illustrated by an example. Table 1 shows the state of the data reduction algorithm at successive DMA interrupts during the course of a cylinder capture cycle. In this example, the time between cylinder firings is 100 milliseconds. Column (1) is the DMA interrupt number. Columns (2) and (3) show the value of REDUCTION_FACTOR and the reduction buffer data count at the start of each DMA ISR. Column (4) shows the reduction buffer data count after addition of new data from the DMA buffer. Columns (5) and (6) show the reduction buffer data count and the REDUCTION_FACTOR, respectively, at the end of each DMA ISR. The data aquisition rate is eight microseconds per sample and PLOT_WIDTH is 560. Thus, the time between DMA interrupts is 8.960 milliseconds ($8*10^{-6}*$PLOT_WIDTH*2).

TABLE 1

| (1) DMA Interrupt Number | (2) Initial Conditions RF | (3) Initial Conditions RB Count | (4) Intermediate RB Count | (5) Final Conditions RB Count | (6) Final Conditions RF |
|---|---|---|---|---|---|
| 1 | 2 | 0 | 560 | 560 | 2 |
| 2 | 2 | 560 | 560 + 560* | 560 | 4 |
| 3 | 4 | 560 | 560 + 280 | 560 + 280 | 4 |
| 4 | 4 | 560 + 280 | 560 + 560* | 560 | 8 |
| 5 | 8 | 560 | 560 + 140 | 560 + 140 | 8 |
| 6 | 8 | 560 + 140 | 560 + 280 | 560 + 280 | 8 |
| 7 | 8 | 560 + 280 | 560 + 420 | 560 + 420 | 8 |
| 8 | 8 | 560 + 420 | 560 + 560* | 560 | 16 |
| 9 | 16 | 560 | 560 + 70 | 560 + 70 | 16 |
| 10 | 16 | 560 + 70 | 560 + 140 | 560 + 140 | 16 |
| 11 | 16 | 560 + 140 | 560 + 210 | 560 + 210 | 16 |

RF = REDUCTION_FACTOR,
RB = Reduction Buffer,
*indicates that Reduction Buffer is full.

As shown in Table 1, each time the reduction buffer is full (indicated by * in column 4), the data therein is reduced by half and the REDUCTION_FACTOR is doubled. DMA Interrupt #11 occurs 98.560 ms after the cylinder fires. The next interrupt will be a cylinder interrupt, which will occur 1.440 ms later. When the cylinder interrupt occurs the DMA buffer will contain 180 data points, which will yield 11 points when reduced by the current REDUCTION_FACTOR of 16. These 11 data points will be added to the 770 data points already in the reduction buffer, for a total of 781 points. Out of these 781 points, 560 will be selected and transferred to the cylinder storage buffer.

These first 560 points selected for display may be, for example, representative of the cylinder firing waveform fully plottable over a 560-pixel horizontal axis of screen 15. If the MPU is initialized for real-time (live) mode processing, the stored cylinder firing data is displayed. In the meantime, the DAS 30 continues to receive and process waveform data corresponding to the next-to-fire cylinder, which cylinder firing data also undergoes data reduction in accordance with the present invention technique, at the end of which, the new 560 points of data of the next-to-fire cylinder is determined and stored in MPU memory 50. This process goes on indefinitely or until MPU operation is terminated. At the end of each engine cycle, which is equal to a predetermined number of cylinder firing cycles, a complete frame of information is available for simultaneous display at the screen 15. Since a complete frame consists of more than one cylinder firing cycle, each of which is represented by 560-points—which also corresponds in the instant case to the maximum pixel length of the screen 15—it necessarily follows that each cylinder firing waveform must be further sized down by a factor equal to the number of cylinder firing cycles in an engine cycle. For example if the operator wishes to look at the plot of a complete engine cycle of a four-cylinder engine (total of four cylinder firings), each 560-point cylinder firing waveform must be reduced by a factor of four to allow all four cylinder firings to be simultaneously displayed.

In the preferred embodiment, the MPU memory 50 is of sufficient memory capacity to store a dozen or more consecutive frames of information for display in non-real-time. This allows an automotive technician to stop data acquisition at any time and review a number of stored frames to aid in engine analysis.

It should be apparent that, since utility is made for data acquisition of a set of consecutive frames, provision can be made so that the information available in memory is plottable in a variety of ways, including display of multiple waveform data in superimposed or vertically spaced relationship. For example, it is possible that data acquisition occurs over separate channels, one for primary signals and another for secondary signals. In such case, a separate set of frames is stored in MPU memory 50 and available for plotting, in either real-time or non-real-time, along vertically-spaced axes on the screen 15.

It is further envisioned that a technician may elect that only the first (or one of the other) cylinder firings for a predetermined number of consecutive frames be plotted along a particular axis on the screen 15.

It should further be apparent that because each cylinder firing waveform includes very sharp transitions in voltage, particularly during the beginning of the cylinder firing, it is important that provision be made that such peaks, not be deleted during data reduction. This could be accomplished using any one of a number of conventional peak-search routines, and easily incorporated in the algorithm of the present invention.

While particular embodiments of the present invention have been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A data acquisition device for plotting at least one cycle of a repetitive analog input signal of varying frequency on a fixed-plot area of a display device having a horizontal plot axis defined by a fixed number of pixels, comprising:

means for continuously sampling, at a constant sample rate, each cycle of the repetitive input signal to generate and collect, during each cycle, consecutive sets of sample points from that cycle;

means for discarding, during the course of each cycle, some of the collected sample points for that cycle; and means for generating, at the completion of each cycle, a final set of sample points from that cycle, equal in number to said fixed number of pixels, and containing sample points from a plurality of said consecutive sets.

2. The data acquisition device of claim 1, wherein said means for generating said final set includes:

a first temporary buffer, a second temporary buffer and a final-set storage buffer;

first interrupt generating means for generating a first interrupt responsive to the collection of all the sample points of any one of said consecutive sets in the first buffer;

sample-point reduction means, responsive to said first interrupt, for selectively transferring at least a portion of the sample points in the first buffer to the second buffer;

end-of-cycle detection means, responsive to a second interrupt indicative of a termination of a cycle, for terminating the transfer to the first buffer of sample points collected by the sampling means since the last one of said first interrupts; and final-set generation means for selectively transferring to the final-set storage buffer:

a first portion of the sample points transferred to the first buffer at the time the second interrupt was generated, and a second portion of the sample points present in the second buffer at the time the second interrupt was generated, said first and second portions being the sample points of said final set.

3. The data acquisition device of claim 2, wherein said sampling means includes a first-in-first out (FIFO) buffer for storing on a first-in-first-out basis each of said consecutive sets, and wherein said first interrupt generating means includes a direct memory access (DMA) controller for transferring each said consecutive sets from the FIFO buffer to the first buffer, whereby at the occurrence of a first interrupt operation of the DMA controller is halted while said sampling means continues to store the sample points of a subsequent one of said consecutive sets in the FIFO buffer, DMA controller operation being resumed before the FIFO buffer becomes full.

4. The data acquisition device of claim 3, wherein said repetitive input signal is an internal combustion engine ignition signal comprised of consecutive, variable-speed, engine firing-cycles, each said cycle being a single, engine-cylinder firing cycle.

5. The data acquisition device of claim 4, wherein said sampling means further includes means for generating the second interrupt in response to the end of each cylinder firing cycle.

6. The data acquisition device of claim 2, wherein said repetitive input signal is an internal combustion engine ignition signal comprised of consecutive, variable-speed, engine firing-cycles, each said cycle being a single, engine-cylinder firing cycle.

7. The data acquisition device of claim 6, wherein said sampling means further includes means for generating the second interrupt in response to the end of each cylinder firing cycle.

8. The data acquisition device of claim 7, further comprising means for storing the final set of sample points for each of consecutive cylinder firing cycles associated with a single engine firing-cycle, and means for displaying on the fixed-plot area of said display device any one or a combination of said stored cylinder firing cycles.

9. The data acquisition device of claim 2, wherein the number of sample points in each of said consecutive sets is greater than the number of sample points in said final set.

10. The data acquisition device of claim 2, wherein the sample-point reduction means includes means for generating a variable reduction factor determinative of the rate at which sample points of an associated consecutive set in the first buffer are to be discarded prior to the remaining points being transferred to the second buffer.

11. The data acquisition device of claim 10, wherein said variable reduction factor increases by a multiple factor when the second buffer becomes full.

12. The data acquisition device of claim 11, wherein said sample-point reduction means includes means for reducing the points in the second buffer by a predetermined factor when the second buffer becomes full.

13. A method for plotting at least one cycle of a repetitive analog input signal of varying-frequency on a fixed-plot area of a display device having a horizontal plot axis defined by a fixed number of pixels, comprising the steps of;

continuously sampling, at a constant sample rate, each cycle of the repetitive input signal to generate and collect, during each cycle, consecutive sets of sample points from that cycle;

discarding, during the course of each cycle, some of the collected sample points for that cycle; and generating at the completion of each cycle, a final set of sample points for that cycle, equal in number to said fixed number of pixels, and containing sample points from a plurality of said consecutive sets.

14. The method of claim 13, wherein said step of generating the final set further includes the steps of:

generating a first interrupt responsive to the collection of all the sample points of any one of said consecutive sets in the first buffer;

selectively transferring, on the basis of a reduction algorithm, and responsive to said first interrupt, at least a portion of the sample points in the first buffer to a second buffer;

terminating the transfer to the first buffer of sample points collected since the last one of said first interrupts, in response to a second interrupt indicative of a termination of a cycle; and selectively transferring to a final-set storage buffer, a first portion of the sample points present in the first buffer at the time the second interrupt was generated, and a second portion of the sample points present in the second buffer at the time the second interrupt was generated, said first and second portions being the sample points of said final set.

15. The method of claim 14, wherein said sampling step further includes the step of storing, in a first-in-first out (FIFO) buffer, and on a first-in-first-out basis, each of said consecutive sets, and wherein the step of generating a first interrupt includes the step of transferring, using a direct memory access (DMA) controller, each said consecutive sets from the FIFO buffer to the first buffer and then halting operation of the DMA controller, the step of sampling including continuing to store the sample points of a subsequent one of said consecutive sets in the FIFO buffer when DMA controller operation is halted, with DMA controller operation being resumed before the FIFO buffer becomes full.

16. The method of claim 14, wherein the number of sample points in each of said consecutive sets is greater than the number of sample points in said final set.

17. The method of claim 14, wherein the reduction algorithm involves the steps of generating a variable reduction factor determinative of the rate at which sample points of an associated consecutive set in the first buffer are to be discarded prior to the remaining points being transferred to the second buffer.

18. The method of claim 17, wherein said variable reduction factor increases by a multiple factor when the second buffer becomes full.

19. The method of claim 18, wherein said reduction algorithm includes the step of reducing the points in the second buffer by a predetermined factor when the second buffer becomes full.

20. The method of claim 14, wherein said repetitive input signal is an internal combustion engine ignition signal comprised of consecutive, variable-speed, engine firing-cycles, each said cycle being a single, engine-cylinder firing cycle, the step of sampling further including the step of generating the second interrupt in response to the end of a cylinder firing cycle.

the method further comprising the steps of storing the final set of sample points of each of consecutive cylinder firing cycles associated with a single engine firing-cycle, and displaying on the fixed-plot area of the display device any one or a combination of said stored cylinder firing cycles.

* * * * *